United States Patent
Giardina et al.

(10) Patent No.: US 7,327,571 B2
(45) Date of Patent: Feb. 5, 2008

(54) THERMAL LOAD BALANCING SYSTEMS AND METHODS

(75) Inventors: Jeffery M. Giardina, Cypress, TX (US); Wade D. Vinson, Magnolia, TX (US); Thomas G. Bumby, Jr., Sugar Land, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 228 days.

(21) Appl. No.: 11/220,049

(22) Filed: Sep. 6, 2005

(65) Prior Publication Data

US 2007/0053161 A1 Mar. 8, 2007

(51) Int. Cl.
*H05K 7/20* (2006.01)

(52) U.S. Cl. ............... 361/700; 361/695; 361/699; 361/704; 174/15.2; 165/80.4; 165/104.26; 165/104.33

(58) Field of Classification Search ............ None
See application file for complete search history.

(56) References Cited

U.S. PATENT DOCUMENTS

| | | | |
|---|---|---|---|
| 6,137,682 A * | 10/2000 | Ishimine et al. ............ 361/704 |
| 6,181,556 B1 | 1/2001 | Allman | |
| 6,493,223 B1 * | 12/2002 | Viswanath et al. ......... 361/690 |
| 6,525,934 B1 | 2/2003 | Nakanishi et al. | |
| 6,687,129 B1 * | 2/2004 | Wilson et al. ............. 361/730 |
| 6,771,497 B2 | 8/2004 | Chen et al. | |
| 6,779,595 B1 | 8/2004 | Chiang | |
| 6,804,115 B2 | 10/2004 | Lai | |
| 6,903,930 B2 | 6/2005 | DiStefano et al. | |
| 6,909,608 B2 | 6/2005 | Fan | |
| 6,918,429 B2 | 7/2005 | Lin et al. | |
| 6,958,914 B2 * | 10/2005 | Hoss ......................... 361/704 |
| 7,044,198 B2 * | 5/2006 | Matsushima et al. ...... 165/80.4 |
| 7,120,027 B2 * | 10/2006 | Yatskov et al. ............. 361/716 |
| 7,177,156 B2 * | 2/2007 | Yatskov et al. ............. 361/709 |
| 7,193,851 B2 * | 3/2007 | Yatskov ..................... 361/710 |
| 2005/0167083 A1 * | 8/2005 | Belady et al. ............. 165/80.3 |
| 2005/0219820 A1 * | 10/2005 | Belady et al. ............. 361/700 |
| 2005/0286230 A1 * | 12/2005 | Yatskov ..................... 361/709 |
| 2006/0232928 A1 * | 10/2006 | Vinson et al. ............. 361/687 |

* cited by examiner

Primary Examiner—Boris Chervinsky

(57) ABSTRACT

Systems and methods for implementing thermal load balancing are disclosed. In an exemplary embodiment, a thermal load balancing system for a multiprocessor computer having a plurality of processors may comprise a heat sink network having a plurality of local heat sinks. The local heat sinks are thermally coupled to separate processors in the multiprocessor computer. At least one heat pipe thermally couples each of the plurality of local heat sinks in the heat sink network.

20 Claims, 4 Drawing Sheets

THERMAL LOAD BALANCING SYSTEMS AND METHODS

TECHNICAL FIELD

The described subject matter relates to thermal management, and more particularly to thermal load balancing systems and methods.

BACKGROUND

Electronic devices generate heat during operation. Indeed, computer systems (e.g., server computers) are now commercially available with multiple processors, thereby generating even more heat than single-processor computer systems. Accordingly, heat dissipation continues to be a concern in the development of computer systems and other electronic devices. If not properly dissipated, heat generated during operation can shorten the life span of various electronic components and/or generally result in poor performance.

Various thermal management systems are available, and typically include a heat sink and/or a cooling fan. The heat sink is positioned adjacent the electronic components generating the most heat (e.g., the processor) to absorb heat. A cooling fan may be positioned to blow air across the heat sink and out an opening formed through the computer housing to dissipate heat into the surrounding environment. However, cooling fans take up space within the computer housing and tend to be noisy.

In addition, various processors in a multiprocessor system, even being identical to one another, may operate at different frequencies and generate more or less heat at various times during operation. Sizing the heat sink and/or cooling fan based on average operating frequencies may result in the system overheating if any processor exceeds average operating frequencies for an extended time. However, sizing the heat sink and/or cooling fan based on a worst-case scenario results in heat sinks that are too big (and therefore heavy and space consuming) and/or cooling fans that are too noisy for typical operation.

SUMMARY

An exemplary thermal load balancing system for a multiprocessor computer having a plurality of processors may comprise a heat sink network having a plurality of local heat sinks. The local heat sinks are thermally coupled to separate processors in the multiprocessor computer. At least one heat pipe thermally couples each of the plurality of local heat sinks in the heat sink network.

In another exemplary embodiment, thermal load balancing may be implemented as a method, comprising: absorbing heat from each processor in a multiprocessor computer at local heat sinks, and distributing heat from the local heat sinks over a heat sink network to substantially balance thermal loading on the local heat sinks.

DETAILED DESCRIPTION

Briefly, thermal load balancing systems and methods may be implemented to dissipate heat in multiprocessor computers or other electronic devices caused by, e.g., physical location of semiconductor chips in the device housing, uneven loads on the processors, different operating frequencies, etc. If one or more processor (or other component) is not cooled as efficiently as other processors, thermal load balancing may be implemented to assist in cooling the other processors.

In an exemplary embodiment, local heat sinks are thermally coupled to separate processors in a multiprocessor computer, and at least one heat pipe thermally couples the heat sinks to one another in a heat sink network. If one or more of the processors is generating more heat than other processors, the excess heat is distributed via the heat pipe to the other heat sinks in the heat sink network. Accordingly, smaller heat sinks may be implemented and efficiently used to dissipate heat. In addition, the computer system may have better acoustics because the cooling fan(s) do not have to operate as often and/or as fast. These and other exemplary embodiments will now be described in more detail with reference to the figures.

Figure 1:
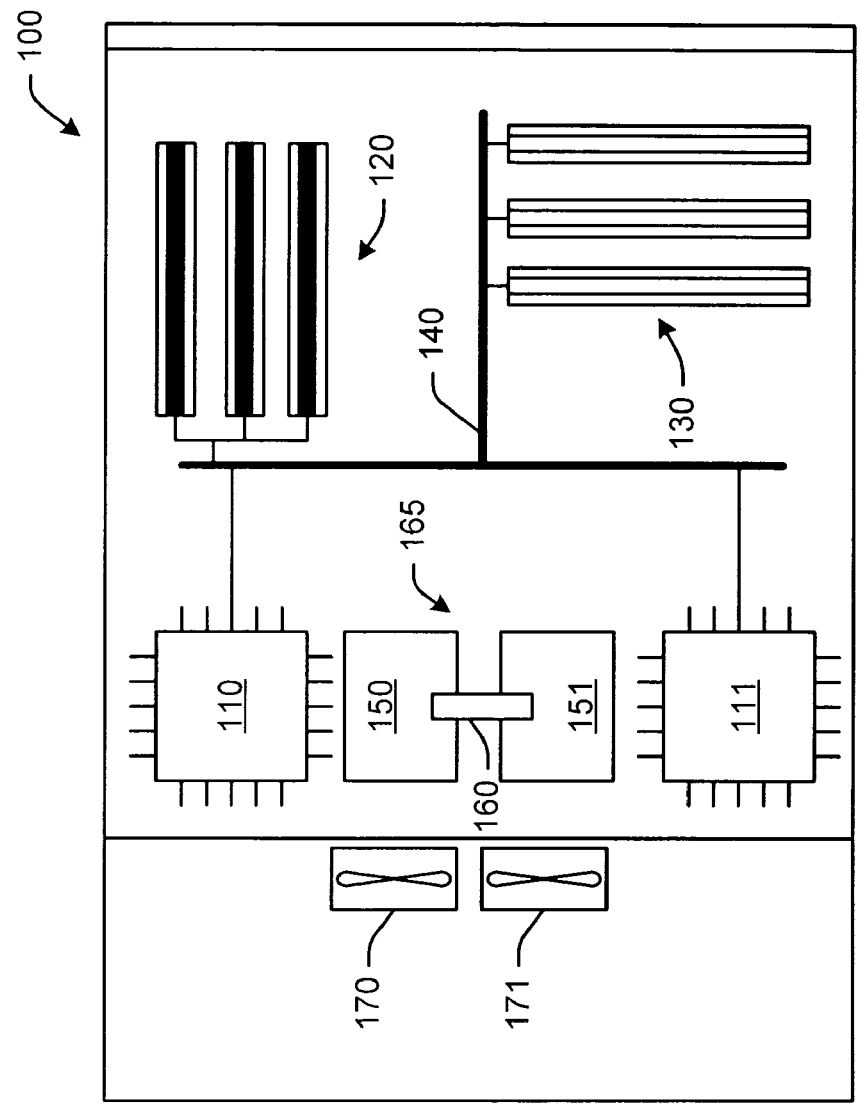
FIG. 1 is a high-level schematic illustration of an exemplary printed circuit board which may implement thermal load balancing.

FIG. 1 is a high-level schematic illustration of an exemplary printed circuit (PC) board which may implement thermal load balancing, e.g., in a computer system (not shown). In an exemplary embodiment, the computer system may be a multiprocessor computer, e.g., commercially available as server computers. However, the systems and methods described herein are not limited to use with any particular type or configuration of computer system.

Exemplary PC board 100 may be mounted within a housing (not shown) of the computer system, such as, e.g., a plastic or metal enclosure suitable for desktop use or for mounting on a rack system. PC board 100 may include one or more processing units or processors 110, 111. PC board 100 may also include other system components, such as, e.g., system memory 120 (e.g., read only memory (ROM) and random access memory (RAM)) and input/output (I/O) ports 130. A bus 140 couples the various system components, including the system memory 120 and I/O ports 130, to the processors 110, 111.

It is noted that PC board 100 may be implemented in a computer system including other devices and components mounted to, connected to, or positioned near the PC board 100. For example, computer systems typically include data storage devices (e.g., hard disk drives, compact disc (CD) or digital versatile disc (DVD) drives, etc.). The computer systems may also operate in a communications network, and therefore include suitable network connection interface(s). These devices and/or interfaces may be connected to the PC board, e.g., via bus 140. Still other devices and components may also be mounted on or otherwise connected to the PC board 100, as is readily apparent to one having ordinary skill in the art.

During operation, one or more of these components (e.g., the processors 110, 111) may generate heat. Accordingly, heat sinks 150, 151 may be provided near or adjacent the components generating the heat to aid in dissipating the heat. In an exemplary embodiment, the heat sinks 150, 151 include blocks of thermally conductive material (e.g., metal or metal alloys) configured to absorb and dissipate the heat generated by processors 110, 111. It is noted that there exist many different heat sinks, and the systems and methods described herein for thermal load balancing are not limited to any particular type or configuration of heat sink.

Heat sinks 150, 151 may be thermally coupled to one another by one or more heat pipe 160, in a configuration referred to herein as a heat sink network 165. One or more cooling fans 170, 171 may also be provided to remove heat from the heat sinks 150, 151, e.g., by distributing heat to the surrounding environment. It is noted that although only two heat sinks 150, 151 are shown in FIG. 1, any number of heat sinks may be implemented for each of the processors. Likewise, any number of heat pipes and/or cooling fans may be implemented.

Each heat sink 150 and 151 functions locally to remove heat. For example, heat sink 150 removes heat generated by processor 110, and heat sink 151 removes heat generated by processor 111. The heat pipe 160 enables thermal load balancing among the heat sinks 150 and 151.

By way of illustration, a multiprocessor computer may include two processors (e.g., processors 110 and 111 in FIG. 1). During an exemplary operation, one of the processors generates 50 watts of heat, and the second processor generates 90 watts of heat. In a conventional computer system, firmware and/or software may respond to any one of the processors generating over 75 watts of heat by increasing the fan speed from low to high, so as to avoid damaging the processors or other system components.

In the thermal load balancing system, however, the heat pipe 160 distributes heat over the heat sink network (e.g., among the heat sinks 150, 151), so that the average heat measured at either heat sink 150, 151 is about 70 watts. Accordingly, the threshold for increasing the fan speed from low to high is not reached in this example, and the cooling fan 170 continues to run at low speed. Not only does the cooling fan last longer by running at low speed, it consumes less electricity and makes less noise.

Thermal load balancing systems and methods may be implemented as a form of "self-regulation" in multiprocessor computers. For example, the heat sinks 150, 151 may be collectively sized to dissipate heat for any one of the processors 110, 111 operating at full-power at any given time, but may be collectively undersized to dissipate heat if all of the processors 110, 111 are operating at full-power at about the same time. Accordingly, operation of the processors 110, 111 is constrained by the ability to dissipate heat so that all of the processors 110, 111 cannot operate at full power simultaneously, but at least any one processor (e.g., processor 110) can operate at full power at any given time.

Such an implementation enables the use of smaller heat sinks than would otherwise be necessary for full-power operation, thereby reducing cost, space consumed by the heat sinks 150, 151, and overall product weight. However, full-power operation for at least one of the processors 110 or 111 at any given time is still possible.

Thermal load balancing may also be implemented to enable multiple processors 110, 111 to be installed in-line, even if one or more of the processors are in the draft of another processor. In a conventional system, heat generated by in-line processors (e.g., processors installed directly adjacent one another) may overlap and adversely affect operation if the heat sink is not large enough to compensate for the additional, overlapping heat. However, thermal load balancing may be implemented to deliver excess heat due to the overlap to other heat sinks in the heat sink network 165 so that the heat does not adversely affect operation of the in-line processors.

In addition, thermal load balancing may also be implemented to compensate for slight misalignment of the processors 110, 111 and the heat sinks 150, 151 relative to one another. In a conventional system, the heat sinks may be sized based on a predetermined positioning of the heat sink adjacent the processor. If a heat sink is misaligned (e.g., positioned too close to the processor or too close another heat generating device), the heat sink may absorb more heat than it is designed for. Thermal load balancing compensates for such misalignment by delivering excess heat to other heat sinks in the heat sink network 165.

Figure 2:
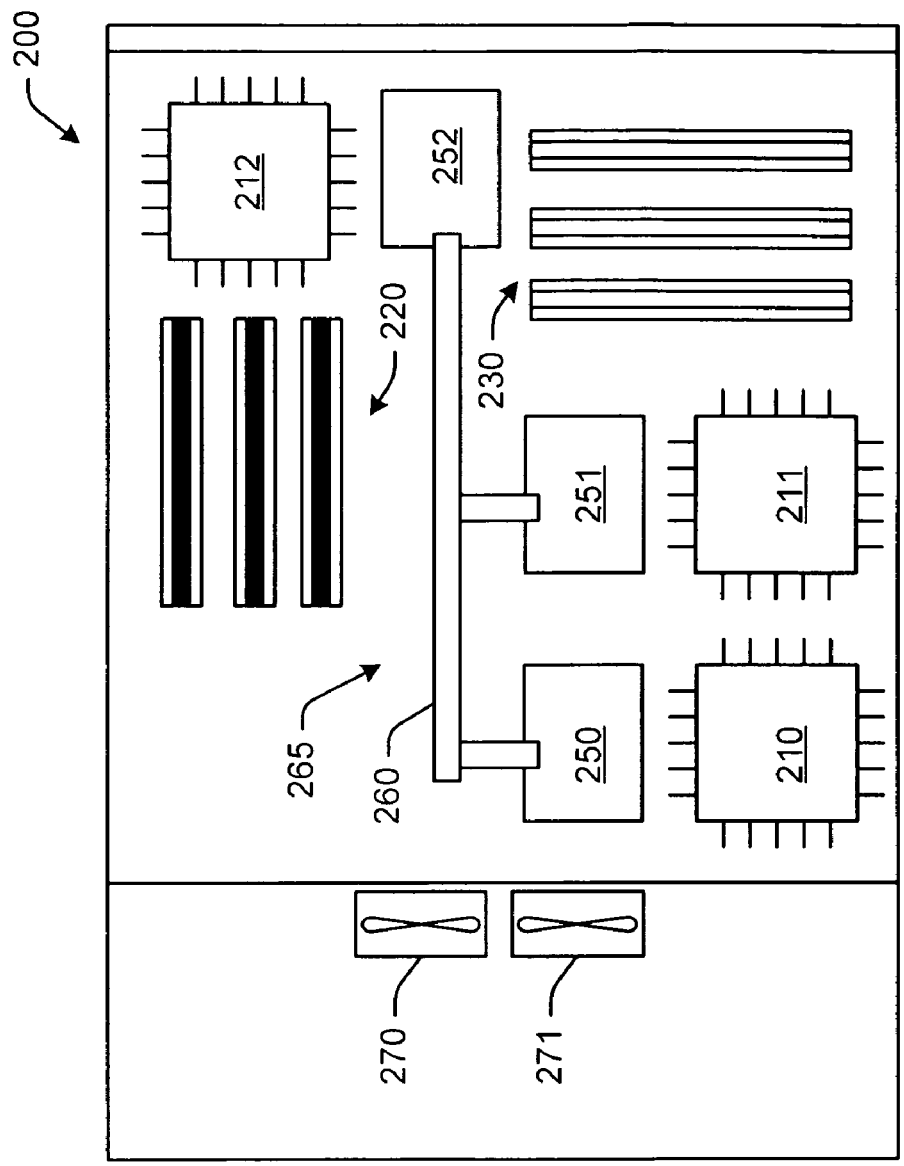
FIGS. 2-4 are high-level schematic illustrations of other exemplary embodiments of thermal load balancing.
Figure 3:
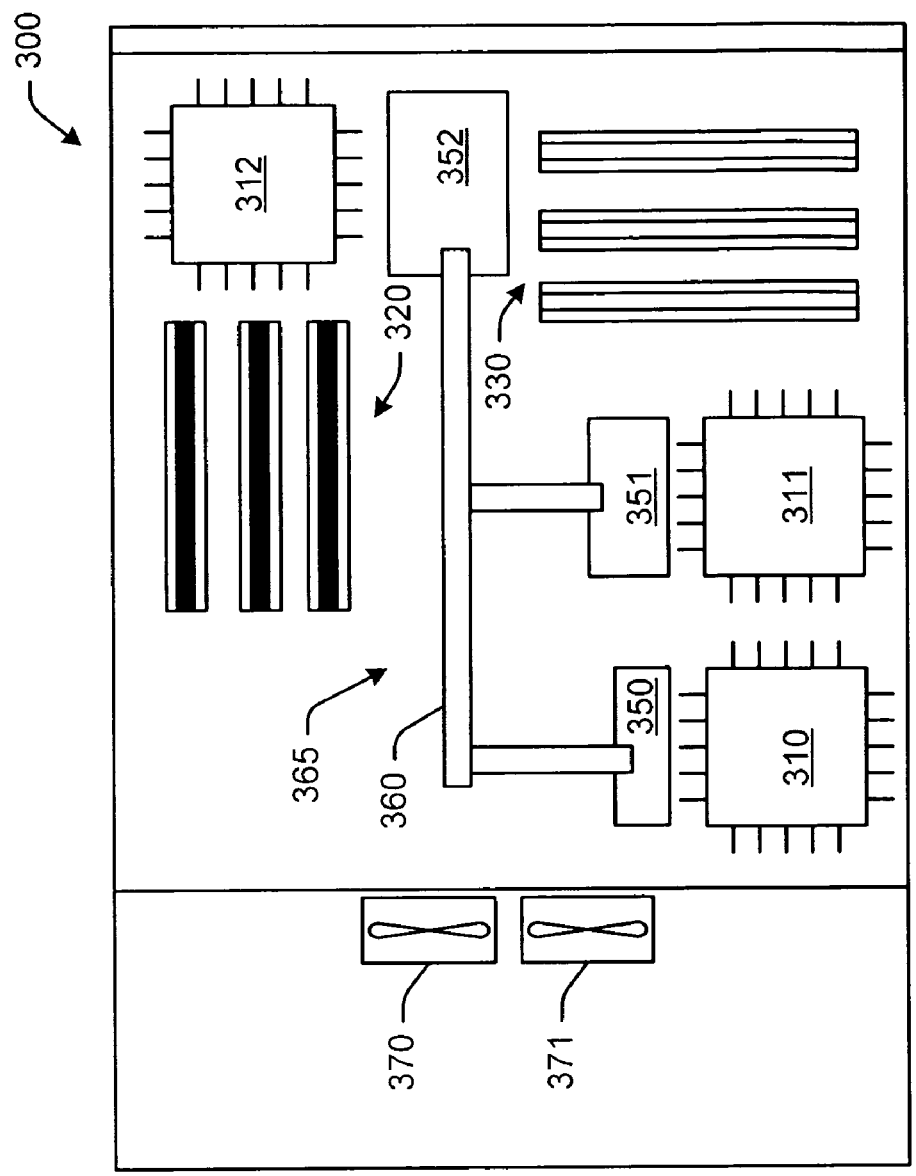
Figure 4:
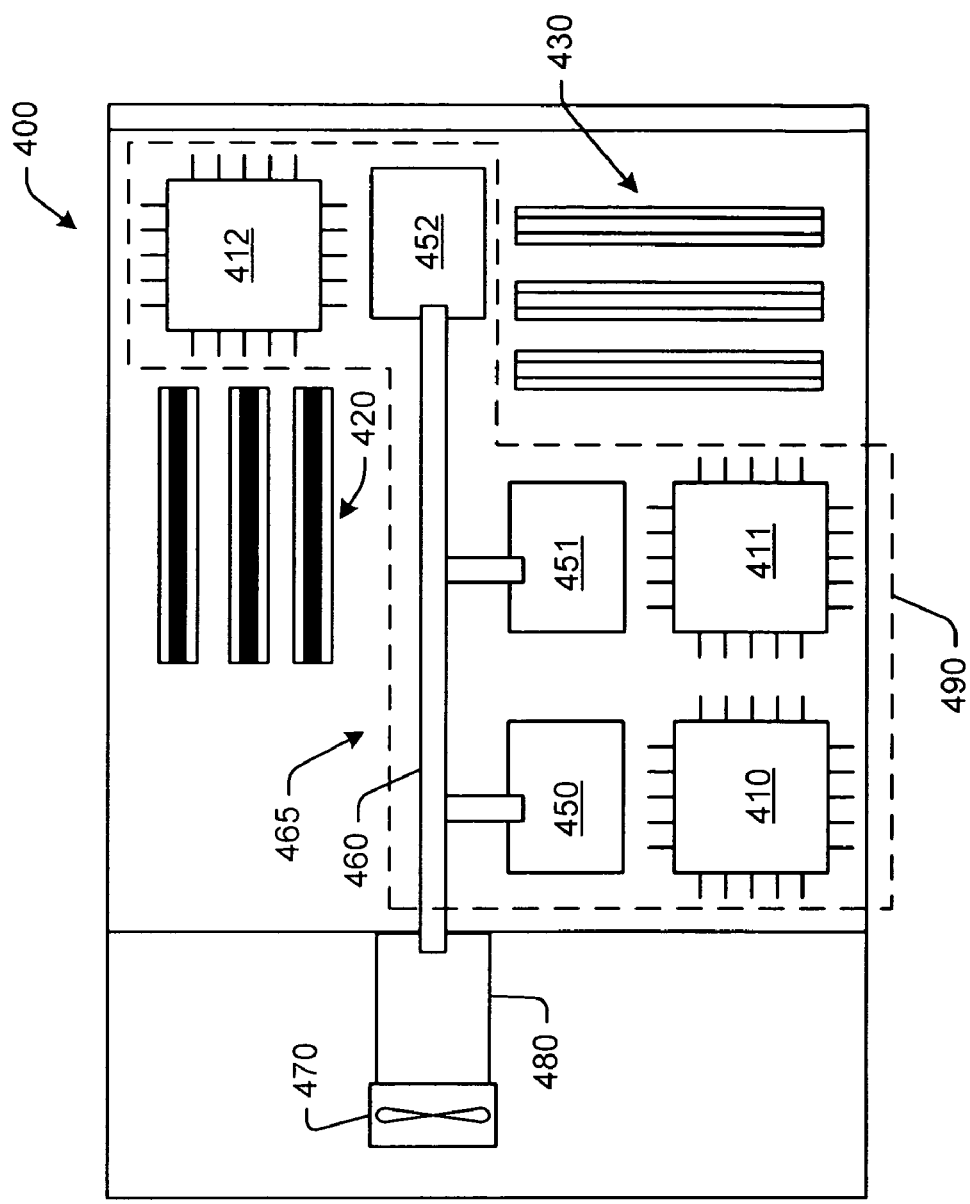

FIGS. 2-4 are high-level schematic illustrations of other exemplary embodiments of thermal load balancing. It is noted that 200-, 300-, and 400-series reference numbers are used to refer to corresponding elements in FIG. 1, and may not be described again with reference to FIGS. 2-4. In addition, the bus (e.g., bus 130 in FIG. 1) is not shown in FIGS. 2-4 for purposes of clarity.

FIG. 2 shows a PC board 200 having a number of processors 210, 211, and 212. Individual heat sinks 250, 251, and 252 are provided to locally remove heat generated by each of the processors 210-212, respectively. The heat sinks 250-252 are thermally coupled to one another by heat pipe 260 to form a heat sink network 265.

In an exemplary embodiment, one of the processors (e.g., processor 212) may be thermally disadvantaged as a result of its position on the PC board 200. For example, processor 212 is positioned in a corner of the PC board 200 adjacent memory 220 and the computer housing (not shown). In addition, cooling fans 270, 271 may not assist heat sink 252 by reason of the relative position of the cooling fans 270, 271 to heat sink 252.

In a conventional system the processor 212 may need to be provided with a larger heat sink than would otherwise be required in order to effectively remove heat generated by the processor 212 due to the position of the processor 212 on the PC board 200. However, thermal load balancing enables excess heat to be delivered via the heat pipe 260 to the other heat sinks 251, 250 in the heat sink network 265 to effectively dissipate heat.

FIG. 3 shows a PC board 300 having a number of processors 310, 311, and 312. Individual heat sinks 350, 351, and 352 are provided to locally remove heat generated by each of the processors 310-312, respectively. The heat sinks 350-352 are thermally coupled to one another by heat pipe 360 to form heat sink network 365.

In a conventional system, each heat sink may need to be sized for a worst-case scenario, e.g., to remove heat from the corresponding processor operating at full power. However, thermal load balancing enables the heat sinks 350-352 to be collectively sized to remove heat for a worst-case scenario (e.g., one or more of the processors operating at full power), without having to size all of the heat sinks for a worst-case scenario. Instead, the heat sink network collectively (or as a whole) provides sufficient capacity to remove heat if one or more of the processors is operating at full power.

It is appreciated that the heat sinks 350-352 may therefore be sized more efficiently. For example, processors which typically generate more heat may be provided with a larger heat sink than processors which typically generate less heat. By way of illustration, heat sink 351 is shown sized larger than heat sink 350, and heat sink 352 is shown sized larger than both heat sinks 350 and 351. But if one of the other processors (e.g., processor 310) generates more heat than was predicted during design, excess heat is distributed to other heat sinks in the heat sink network 365 (e.g., heat sinks 351, 352).

FIG. 4 shows a PC board 400 having a number of processors 410, 411, and 412. Individual heat sinks 450, 451, and 452 are provided to locally remove heat generated by each of the processors 410-412, respectively. The heat sinks 450-452 are thermally coupled to one another by heat pipe 460 to form heat sink network 465.

The heat sink network 465 may also include a master heat sink 480. Master heat sink 480 may be thermally coupled to the other heat sinks 410-412, e.g., via heat pipe 460. In an exemplary embodiment, the master heat sink 480 is provided outside of a thermal boundary 490. The term "thermal boundary" is used herein to describe a physical area that is at a higher temperature than the surrounding area. Also in an exemplary embodiment, the master heat sink 480 may be thermally coupled to one or more cooling fan 470. Accordingly, master heat sink 480 may be implemented to more effectively and quickly remove heat than might otherwise be possible by the local heat sinks 450-452 alone.

It is noted that the exemplary embodiments discussed above are provided for purposes of illustration. Still other embodiments are also contemplated. It is also noted that, although the systems and methods are described with reference to computer systems, in other exemplary embodiments, thermal load balancing may be implemented for other electronic devices, such as, e.g., peripheral devices for computers, video and audio equipment, etc.

In addition to the specific embodiments explicitly set forth herein, other aspects and embodiments will be apparent to those skilled in the art from consideration of the specification disclosed herein. It is intended that the specification and illustrated embodiments be considered as examples only.

The invention claimed is:

1. A thermal load balancing system for a multiprocessor computer having a plurality of processors, comprising:
   a heat sink network having a plurality of local heat sinks, the local heat sinks thermally coupled to separate processors in the multiprocessor computer wherein the heat sink network is collectively undersized to dissipate heat if all of the processors operate at full-power at about the same time; and
   at least one heat pipe thermally coupling each of the plurality of local heat sinks in the heat sink network.

2. The system of claim 1 wherein the heat sink network includes a one-to-one correspondence of local heat sinks to separate processors.

3. The system of claim 1 wherein at least two processors are positioned in-line with one another.

4. The system of claim 1 wherein at least two of the plurality of local heat sinks are different sizes relative to one another.

5. The system of claim 1 wherein at least one of the plurality of local heat sinks is undersized for dissipating heat during full-power operation of at least one of the processors.

6. The system of claim 1 wherein the heat sink network is collectively sized to dissipate heat for any one of the processors operating at full-power at any given time.

7. The system of claim 1 wherein the heat sink network dissipates heat from at least one processor in a thermally disadvantageous physical location.

8. The system of claim 1 further comprising at least one master heat sink thermally coupled to the heat sink network, the master heat sink positioned outside a thermal boundary around the processors.

9. The system of claim 8 further comprising at least one cooling fan thermally coupled to the master heat sink.

10. A method of thermal load balancing, comprising:
    absorbing heat from each processor in a multiprocessor computer at local heat sinks;
    distributing heat from the local heat sinks over a heat sink network to substantially balance thermal loading on the local heat sinks; and sizing the heat sink network to prevent full-power operation of all the processors at about the same time.

11. The method of claim 10 wherein distributing heat from the local heat sinks is at least in part to a master heat sink in the heat sink network.

12. The method of claim 10 further comprising compensating for thermal effects of a misaligned local heat sink and processor.

13. The method of claim 10 wherein absorbing heat is from different size local heat sinks.

14. The method of claim 10 further comprising dissipating heat during full-power operation of at least one processor even if at least one of the local heat sinks is undersized for full-power operation.

15. The method of claim 10 further comprising collectively sizing the heat sink network to dissipate heat for any one processor operating at full-power.

16. The method of claim 10 further comprising self-regulating full-power operation of the processors.

17. A system for thermal load balancing, comprising:
    local heat-collection means for absorbing heat from a plurality of components in an electronic device wherein each heat-collection means is undersized for dissipating heat by itself; and
    heat-distribution means for distributing heat to substantially balance thermal loading of the local heat-collection means.

18. The system of claim 17 wherein at least two of the local heat-collection means are different sizes relative to one another.

19. A thermal load balancing system for a multiprocessor computer having a plurality of processors, comprising:
    a heat sink network of local heat sinks thermally coupled to separate processors in the multiprocessor computer, the heat sink network collectively sized to dissipate heat for any one of the processors operating at full-power at any given time, and the heat sink network collectively undersized to dissipate heat if all of the processors operate at full-power at about the same time; and
    at least one heat pipe thermally coupling the local heat sinks together in the heat sink network.

20. The system of claim 19 wherein at least one of the local heat sinks is undersized for dissipating heat by itself during full-power operation of at least one of the processors.

* * * * *